United States Patent [19]
Maier et al.

[11] Patent Number: 5,001,428
[45] Date of Patent: Mar. 19, 1991

[54] METHOD FOR MAPPING THE RF TRANSMIT AND RECEIVE FIELD IN AN NMR SYSTEM

[75] Inventors: Joseph K. Maier, Milwaukee; Gary H. Glover, Delafield, both of Wis.

[73] Assignee: General Electric Company, Milwaukee, Wis.

[21] Appl. No.: 396,578

[22] Filed: Aug. 21, 1989

[51] Int. Cl.⁵ .............................................. G01R 33/20
[52] U.S. Cl. .................................................... 324/309
[58] Field of Search ............... 324/307, 309, 308, 310, 324/312, 317

[56] References Cited

U.S. PATENT DOCUMENTS

4,616,183 10/1986 Glover et al. ....................... 324/313
4,713,614 12/1987 Hoshino et al. ..................... 324/309
4,745,364 5/1988 Hatanaka ............................ 324/309

Primary Examiner—Hezron E. Williams
Assistant Examiner—Louis M. Arana
Attorney, Agent, or Firm—Quarles & Brady

[57] ABSTRACT

An NMR system for producing images carries out a procedure in which field maps are produced that indicate inhomogeneities in the transmitted RF excitation field and inhomogeneities in the RF receive field. Intensity NMR data is acquired using a set of different RF excitation field strengths and separate transmit and receive arrays are produced by fitting a characteristic curve to the data. A variety of images which display RF inhomogeneities may be produced from these two arrays.

10 Claims, 6 Drawing Sheets

METHOD FOR MAPPING THE RF TRANSMIT AND RECEIVE FIELD IN AN NMR SYSTEM

BACKGROUND OF THE INVENTION

The field of the invention is nuclear magnetic resonance (NMR) systems and methods and, more particularly, systems for measuring the homogeneity of the transmitted RF excitation field and the homogeneity of the received NMR signal.

NMR imaging employs a combination of pulsed magnetic field gradients and pulsed radio frequency fields to obtain NMR imaging information from nuclear spins situated in selected regions of a sample to be imaged. The sample is typically positioned in a static magnetic field effective to polarize nuclear spins having a net magnetic moment so that a greater number of spins align with the polarizing magnetic field and add to produce a net magnetization. The individual polarized nuclear spins, and hence, the net magnetization M, resonate, or precess about an axis of the polarizing magnetic field at a frequency equal to a gyromagnetic constant times the magnitude of the magnetic field. This relationship is known as the Larmor relationship. A gyromagnetic constant exists for each NMR isotope. For a hydrogen nucleus (the most abundant atomic nucleus in a living body) the gyromagnetic constant is about 42.58 MHz/Tesla. With a magnetic field of about 1.5 Tesla, for example, the resulting resonant frequency for hydrogen nuclei predicted by the Larmor relationship is about 63.9 MHz.

In order to obtain a detectable NMR signal, the net magnetization of the nuclear spins is rotated away from coincidence with the axis of the polarizing magnetic field. Rotation is performed using a radio frequency excitation field of the same frequency as that determined by the Larmor relationship. The angle through which the net magnetization is rotated, or "flipped", is related to the field strength of the radio frequency excitation signal and to its duration. At the end of the radio frequency excitation pulse, the nuclei, in relaxing to their normal spin conditions, generate a decaying signal at the same radio frequency as that used for excitation. This NMR signal is picked up by a receive coil, amplified and processed by the NMR system.

As noted above, the angle through which the net magnetization is rotated depends on the radio frequency field strength and duration NMR imaging generally requires that the net nuclear magnetization be rotated by some specified angle. Rotation to angles varying from these specific angles can produce a variety of problems in the reconstructed image. A full discussion of such problems and one solution therefor is given in U.S. Pat. No. 4,443,760, the disclosure of which is incorporated herein by reference.

Besides adding ghost artifacts to the received signal, errors in radio frequency field strength and pulse duration substantially reduce the amplitude of the received NMR signal. Since the received radio frequency NMR signal is small at best, reduction thereof, with a concomitant degradation in signal-to-noise ratio, is not desirable.

The combination of radio frequency field strength an pulse duration required to produce a particular rotation of net magnetization varies from object to object being imaged. In general, the more massive the body to be imaged, the higher the field strength and/or pulse duration. Also, the required field strength and duration varies with the type of material through which the exciting radio frequency pulse must travel to excite the material being imaged. When the body being imaged is a portion of a human anatomy, for example, the excitation by the radio frequency field varies with patient weight, the portion of the body being imaged, and the proportion of body fat, among other things.

Before the commencement of each NMR scan, it is common practice to adjust the frequency of the RF transmitter and receiver to insure that the RF excitation field is at the optimal Larmor frequency. Such a procedure is disclosed in U.S. Pat. No. 4,806,866, which is entitled "Automatic RF Frequency Adjustment For Magnetic Resonance Scanner", and which describes a calibration sequence that automatically determines the best RF transmitter and receiver frequency at the beginning of each NMR scan.

Similarly, before the commencement of each NMR scan, it is common practice to adjust the strength of the transmitted RF excitation field and the gain of the RF receiver so that accurate 90° and 180° flip angles are produced by the RF excitation field pulses. A method for making this adjustment automatically is disclosed in co-pending U.S. Pat. application Ser. No. 06/907,519 filed on Sept. 15, 1986 and entitled "Automatic Transmit and Receive Attenuation Prescaling In Nuclear Magnetic Resonance Scanner".

While the above described techniques insure that the RF excitation pulses have the optimal frequency, strength and duration to evoke the desired NMR signal, this does not necessarily mean that the expected RF excitation field will be produced uniformly throughout the region of interest, or that the resulting NMR signals will be received uniformly from all locations in the region of interest. Indeed, the RF field produced by most transmit coils as loaded by the subject being studied is not homogeneous and the receive field of most receive coils is similarly not homogeneous. This is particularly true of so-called surface coils which are relatively small coils that are designed to image specific regions of human anatomy. Even if the transmit and receive coil fields are homogeneous, penetration of the RF field into the subject may not be uniform throughout the region of interest and the subject or sample under study may load the coils in a nonuniform manner. Also, mutual inductance between the transmit and receive coils may cause further inhomogeneities in the transmit and receive fields.

Regardless of the reason, the lack of homogeneity in the transmitted or received fields causes undesirable low spatial frequency image intensity shading. This is often manifested in the reconstructed images as dark regions that resemble underexposed photographs or light regions that resemble overexposed photographs.

SUMMARY OF THE INVENTION

The present invention relates to a method and means for mapping the strength of the transmitted RF excitation field and for mapping the receptivity of the RF receiver field. More particularly, the invention includes: means for producing a set of intensity arrays, each array being produced by an NMR scan conducted at a different RF excitation field strength; means for fitting a curve to each set of corresponding data elements in the set of intensity arrays; means for determining the peak in each of the fitted curves and producing therefrom corresponding data elements in a receive array and a transmit array; and producing a field map which indicates by the intensity of its data elements inhomogeneities in the RF field.

A general object of the invention is to produce a display that quantitatively indicates inhomogeneities in the transmit field and the receive field. The data in the receive array can be combined in a number of ways to produce a field map that reveals inhomogeneities in the RF receive field. Similarly, a separate field map can be produced from data in the transmit array that reveals inhomogeneities in the RF transmit field.

A more specific object of the invention is to provide a procedure and system which facilitates the detection and assessment of inhomogeneities in the transmitted RF excitation field and the RF receive field in an NMR system. The present invention is a procedure which may be executed by the NMR system to calibrate, check, or diagnose problems in its own RF systems. It is particularly useful in evaluating the performance of RF excitation coils and RF receive coils used in the NMR system and how their performance is affected by the subject of the NMR scan and by each other.

Another general object of the invention is to provide a means for separating effects on the acquired NMR data due to RF transmit field inhomogeneities from those due to RF receive field inhomogeneities. The combined effects of RF inhomogeneities are easily seen as shading in an image produced by scanning a homogeneous object. The present invention enables separate images to be produced which reveal only RF transmit field inhomogeneities or only RF receive field inhomogeneities. RF problems can thus be more clearly and separately identified.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
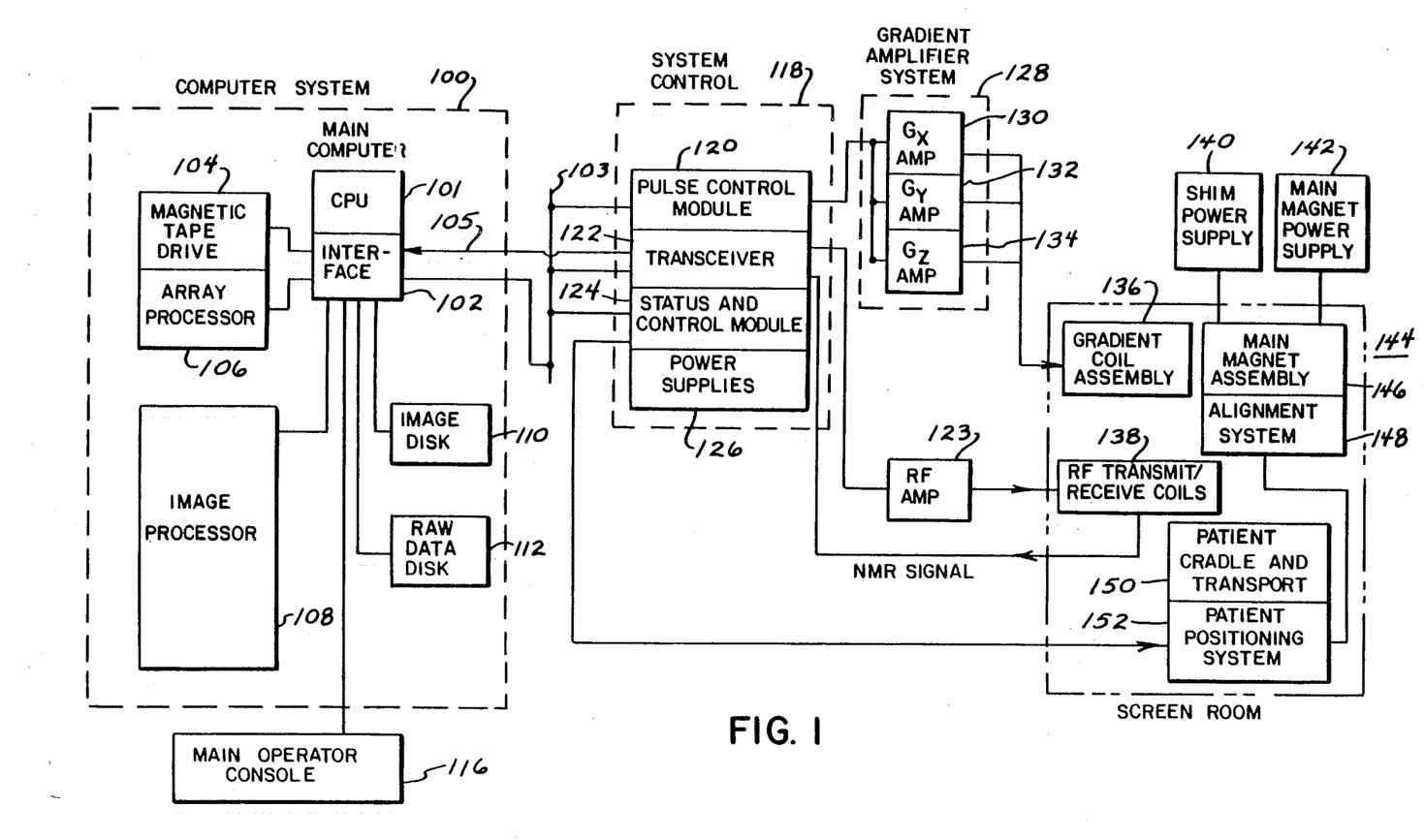
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNAL". The overall operation of the system is under the control of a host computer system generally designated 100 which includes a main computer 101 (such as a Data General MV4000) The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. An array processor 106 is utilized for preprocessing data and for image reconstruction. The function of image processor 108 is to provide interactive image display manipulation such as magnification, image comparison, gray-scale adjustment and realtime data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system exercises control over the NMR system by means of system control 118 and gradient amplifier system 128. The computer 100 communicates with system control 118 by means of a serial digital communication network 103 (such as the Ethernet network) in a manner well known to those skilled in the art. The system control 118 includes several subsystems such as the pulse control module (PCM) 120, a radio frequency transceiver 122, a status control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136 and which is part of a magnet assembly 146. When energized the gradient coils generate magnetic field gradients $G_x$, $G_y$ and $G_z$ of the magnetic field in the same direction as the main polarizing magnetic field. The gradients are directed in mutually orthogonal X-, Y- and Z-axis directions of a Cartesian coordinate system. That is, if the magnetic field generated by the main magnet (not shown) is directed in the z direction and is termed $B_O$, and the total magnetic field in the direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 128 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform module in accordance with the control signals to an RF power amplifier 123 which then energizes RF coils 138 which are situated within main magnet assembly 146. The NMR signals radiated by the excited nuclei in the patient are sensed by the same or a different RF coil than issued for transmitting. The signals are detected, amplified, demodulated, filtered, and digitized in the receiver section of the transceiver 122. The processed signals are transmitted to the main computer 101 for processing by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as an Intel 8086) for processing commands from the main computer 101. The SCM 124 includes means for acquiring information regarding patient cradle position, and the position of the movable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The shim power supply 140 is utilized to energize shim coils associated with the main magnet and which are used to correct inhomogeneities in the polarizing magnetic field. In the case of a resistive magnet, main magnet power supply 142 is utilized to continuously energize the magnet In the case of a superconductive magnet, the main magnet power supply 142 is utilized to bring the polarizing field produced by the magnet to the proper operating strength and is then disconnected. In the case of a permanent magnet, power supply 142 would not be needed.

The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room. A bi-directional attenuation of approximately 100 db. is typical in the 63 MHz to 64 MHz frequency range of operation.

Figure 2:
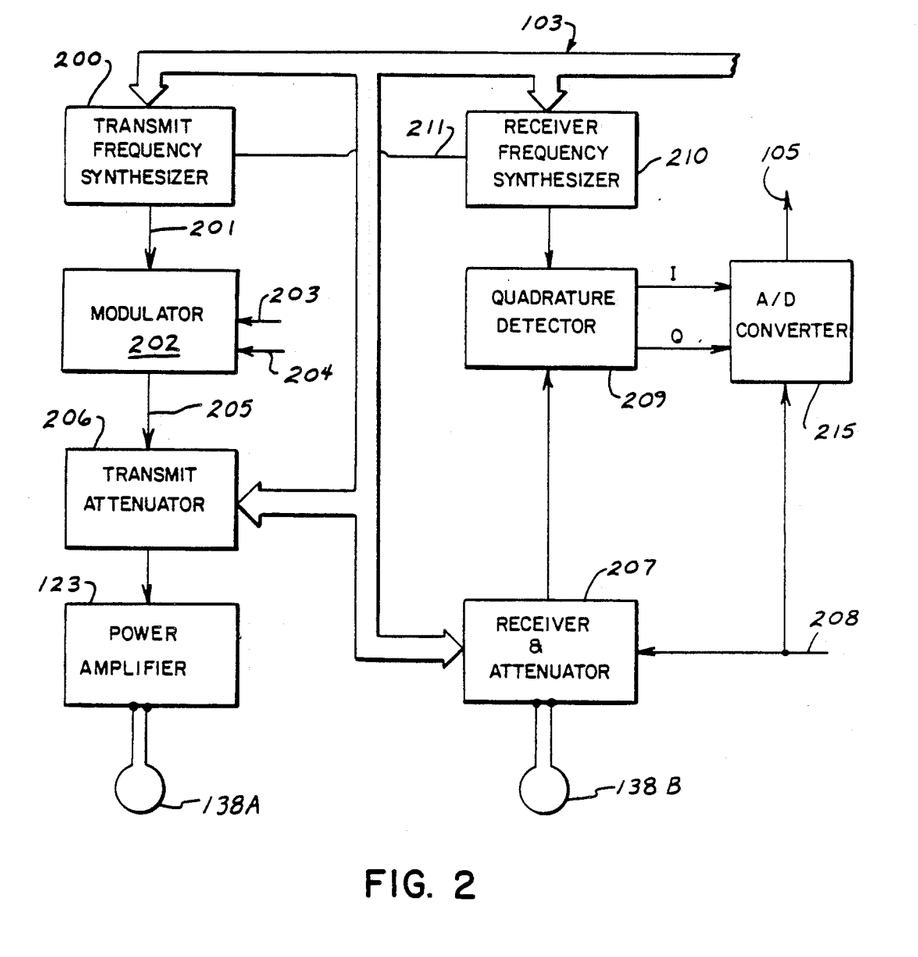
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals (CF) through the communications link 103 from the main computer 101. These digital signals indicate the frequency which is to be produced at an output 201 at a resolution of one Hertz. The commanded RF carrier is applied to a modulator 202 where it is frequency and amplitude modulated in response to signals received through line 203, and the resulting RF excitation signal is turned on and off in response to a control signal from the PCM 120 received through line 204. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A.

Referring still to FIGS. 1 and 2, the NMR signal produced by the subject is picked up by the receiver coil 138B and applied to the input of a receiver 207. The receiver 207 amplifies the NMR signal and this is then attenuated by an amount determined by a digital attenuation signal (RA) received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through filters to a pair of analog-to-digital converters indicated collectively at 215. These A/D converters are enabled by the control line 208 to produce digitized NMR data only when a valid signal is present. This data is output to the main computer 101 through line 105. The filters at the inputs to the A/D converters are controlled by the main computer 101 to limit the bandwidth of I and Q. The quadrature detector 209 also receives an RF reference signal from a second frequency synthesizer 210 and this is employed by the quadrature detector 209 to sense the amplitude of that component of the NMR signal which is in phase with the transmitter RF carrier and the amplitude of that component of the NMR signal which is in quadrature therewith. The frequency synthesizer 210 receives digital signals (CF) through the link 103 which determine the frequency of the demodulation signal. The phase of the two synthesizers 200 and 210 is locked together through a line 211, and in most measurements, the frequency of the two synthesizers is the same.

Figure 3:
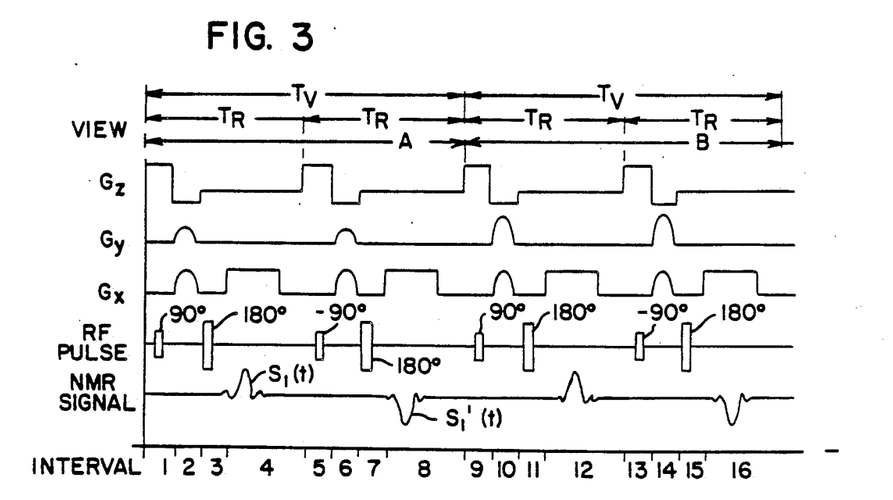
FIG. 3 is a graphic representation of a pulse sequence which may be employed to practice the present invention.

Referring to FIG. 3, two views are shown of a conventional imaging pulse sequence of the type known as two dimensional Fourier transforms (2DFT), and which is also referred to as two-dimensional "spin-warp". This pulse sequence is useful in obtaining, in a well known manner, imaging NMR data to reconstruct images of an object being investigated. The two views are indicated at "A" and "B" and they are identical with the exception of the phase encoding gradient field $G_y$.

Each view is a pulse sequence which utilizes phase-alternated RF excitation pulses which as disclosed and claimed in U.S. Pat. No. 4,443,760 produce phase-alternated NMR signals $S_1(t)$ and $S_1'(t)$ to cancel certain baseline errors in the NMR system.

As shown in FIG. 3 at interval 1 (indicated along the horizontal axis), a selective 90° RF excitation pulse is applied in the presence of a positive $G_z$ magnetic field gradient pulse. Pulse control module 120 (FIG. 1) provides the needed control signals to the frequency synthesizer 200 and modulator 202 (FIG. 2) so that the resulting excitation pulse is of the correct phase and frequency to excite nuclear spins only in a predetermined region of the object being imaged. Typically, the excitation pulse can be amplitude modulated by a (sin x)/x function The frequency of the synthesizer 200 is dependent on the strength of the applied polarizing magnetic field and the particular NMR species being imaged in accordance with the well known Larmor equation. The pulse control module 120 also applies activating signals to the gradient power supplies 128 to generate, in this case, the $g_z$ gradient pulse.

Continuing with reference to FIG. 3, $G_x$, $G_y$ and $G_z$ gradient pulses are applied simultaneously in interval 2. The $g_z$ gradient in interval 2 is a rephasing pulse typically selected such that the time integral of the gradient waveform over interval 2 is approximately equal to $-\frac{1}{2}$ of the time integral of the $g_z$ gradient waveform over interval 1. The function of the negative $g_z$ pulse is to rephase the nuclear spins excited in interval 1. The $G_y$ gradient pulse is a phase encoding pulse selected to have a different amplitude in each of Views A, B, . . . , etc., to encode spatial information in the direction of the gradient. The number of different $G_y$ gradient amplitudes is typically selected to equal at least the number of pixel resolution elements which the reconstructed image will have in the phase encoding (Y) direction. Typically, 128, 256 or 512 different gradient amplitudes $G_y$ are employed in a complete NMR scan, and in the typical NMR system the $G_y$ values are incremented a fixed amount from one view to the next until the NMR scan is complete.

The $G_x$ gradient pulse in interval 2 is a dephasing pulse needed to dephase the excited nuclear spins by a predetermined amount to delay the time of occurrence of a spin-echo signal $S_1(t)$ in interval 4. The spin-echo NMR signal is produced typically by the application of a 180° RF pulse in interval 3. As is known, the 180° RF pulse is a pulse which reverses the direction of system induced dephasing (i.e. nonchemical dephasing) so as to produce the spin-echo signal. The spin-echo NMR signal is sampled in interval 4 in the presence of a readout gradient pulse $G_x$ to frequency encode spatial information in the direction (X) of this readout gradient.

As indicated above, baseline error components can be eliminated by using an additional NMR measurement in each view. This second measurement is substantially identical to the first with the exception that the RF excitation pulse in interval 5 of View A is selected to be 180° out of phase (as suggested by the minus sign) relative to the excitation pulse in interval 1 of View A. As a result, the spin-echo NMR signal $S_1'(t)$ in interval 8 is 180° out of phase with the spin-echo signal $S_1(t)$ in interval 4. If the signal $S_1'(t)$ is subtracted from $S_1(t)$, only those components of the signals with reversed sign in the signal $S_1'(t)$ are retained. The baseline error components thus cancel. The pulse sequence of FIG. 3 is repeated for View B, C, D, and so on, for all values of the phase encoding gradient $G_y$.

Figure 4:
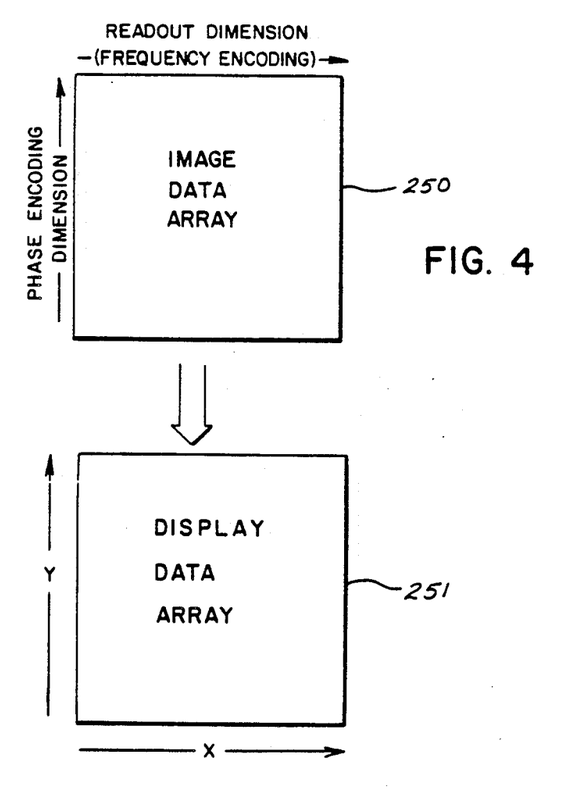
FIG. 4 is a pictorial representation of the data produced by the NMR system of FIG. 1.

Referring particularly to FIG. 4, the resulting acquired NMR data is stored in digital form in an image data array 250. The image data array 250 is a two-dimensional array which stores each sampled and digitized NMR signal as a series of elements along a row of the array (the readout dimension). Each such row of data is associated with a particular View and these are arranged in order along the other dimension of the array, the phase encoding dimension. As is well known in the art, a two-dimensional Fourier transformation is then performed on the image data array 250 to produce a two-dimensional display data array 251. The display data array 251 may be mapped to a CRT, for example, to control the brightness of each pixel on its screen. Each element of the display data array 251 indicates by its intensity, the level of the received NMR signal at a corresponding x, y location in the slice being imaged. These intensity values in turn control the brightness of corresponding pixels on the CRT screen to produce an image.

It can be appreciated by those skilled in the art that the above description of the processing is a simplification. In fact, the image data array 250 exists as two arrays, one for the in phase, or I values, of the acquired NMR signals, and one for the quadrature, or Q values. The Fourier transformations are performed on these complex values and the display data array 251 is produced by calculating the square root of the sum of the squares of corresponding elements in the resulting transformed arrays. It can also be appreciated that many other NMR pulse sequences and processing methods may be employed to produce the display data array 251, and that the present invention is applicable to all of them.

For the proper operation of the above described NMR system, it is necessary that the transmit coil 138A (FIG. 2) produce a uniform, or homogeneous, RF excitation field of the proper strength and duration throughout the entire region of interest. To the extent that this is not the case, the net magnetization of the nuclear spins at different locations in the excited slice will not be tipped at the desired 90° and 180° indicated by the pulse sequence of FIG. 3. Consequently, the NMR signal produced at such locations will not have the proper amplitude and the corresponding locations in the display data array 251 (FIG. 4) will have incorrect intensity values. In the pulse sequence of the preferred embodiment, this results in regions of the display data array 251 with lower intensity values. These lower intensity values produce undesirable dark shading in the displayed image.

Even if the RF excitation field is produced homogeneously throughout the region of interest with an unloaded coil 138A, this does not insure that all the nuclear spins "see" the same field, or that the receive coil 138B receives the resulting NMR signals uniformly throughout the region of interest For example, the loading effects of the patient may distort the otherwise homogeneous RF excitation field of the unloaded coil 138A, or the receive field of the receive coil 138B may not be homogeneous. The result again is distortion of the intensity values in the display data array 251 with consequent shading effects in the displayed image.

Figure 5:
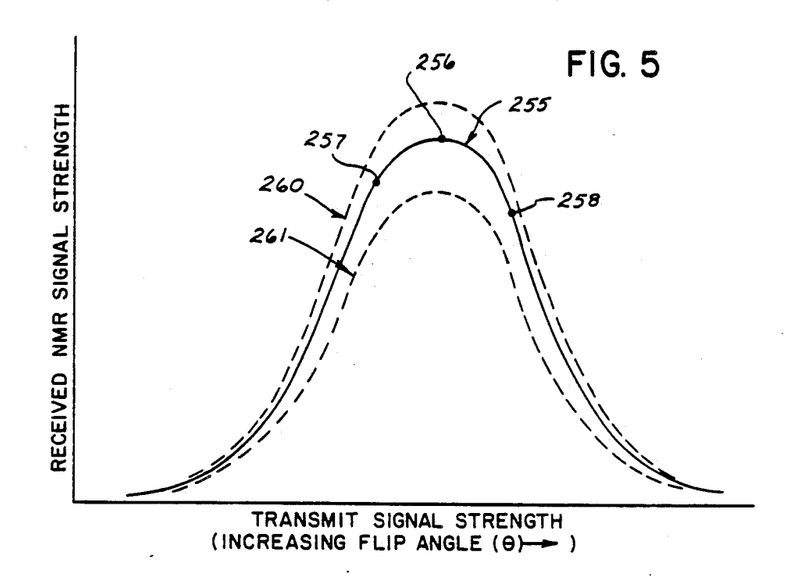
FIG. 5 is a graphic representation of the NMR signal strength produced by the system of FIG. 1.

The effects of all these inhomogeneities on the acquired NMR signals is illustrated in FIG. 5. The curve 255 is a plot of the strength of the received NMR signal produced by a voxel of nuclear spins as a function of the strength of the applied RF excitation field. A change in RF excitation field strength and/or duration corresponds to a change in net magnetization flip angle ($\theta$). The curve 255 for the pulse sequence of FIG. 3 has a $\sin^3\theta$ shape in the ideal case.

Referring still to FIG. 5, if the transmit attenuator TA is set to the nominal value such that the nuclear spins see precise 90° and 180° pulses, a maximum NMR signal, as indicated at point 256, will be produced On the other hand, if the nuclear spins are flipped by lesser amounts because the RF transmit field strength is lower, a smaller NMR signal is produced, a indicated by the point 257. Similarly, the NMR signal is reduced if the nuclear spins are subjected to a slightly higher RF transmit field strength, as indicated at point 258. Thus, variations in the NMR signal due to inhomogeneities in the transmitted RF excitation field will lie on this bell-shaped curve 255.

Variations in the strength of the received NMR signals also occur due to inhomogeneities in the receive field of the coil 138B (FIG. 2). Such variations are indicated in FIG. 5 by the dashed line curves 260 and 261. The shapes of the curves 255, 260 and 261 are the same (i.e. $\sin^3\theta$), but their amplitudes are different. Dashed curve 260 is a plot of the NMR signal received from a location in the field of interest where the receive coil 138B has a higher sensitivity, and dashed curve 261 is a plot of the NMR signal received from a region of lower receive sensitivity and/or lower signal strength.

Figures 6A, 7:
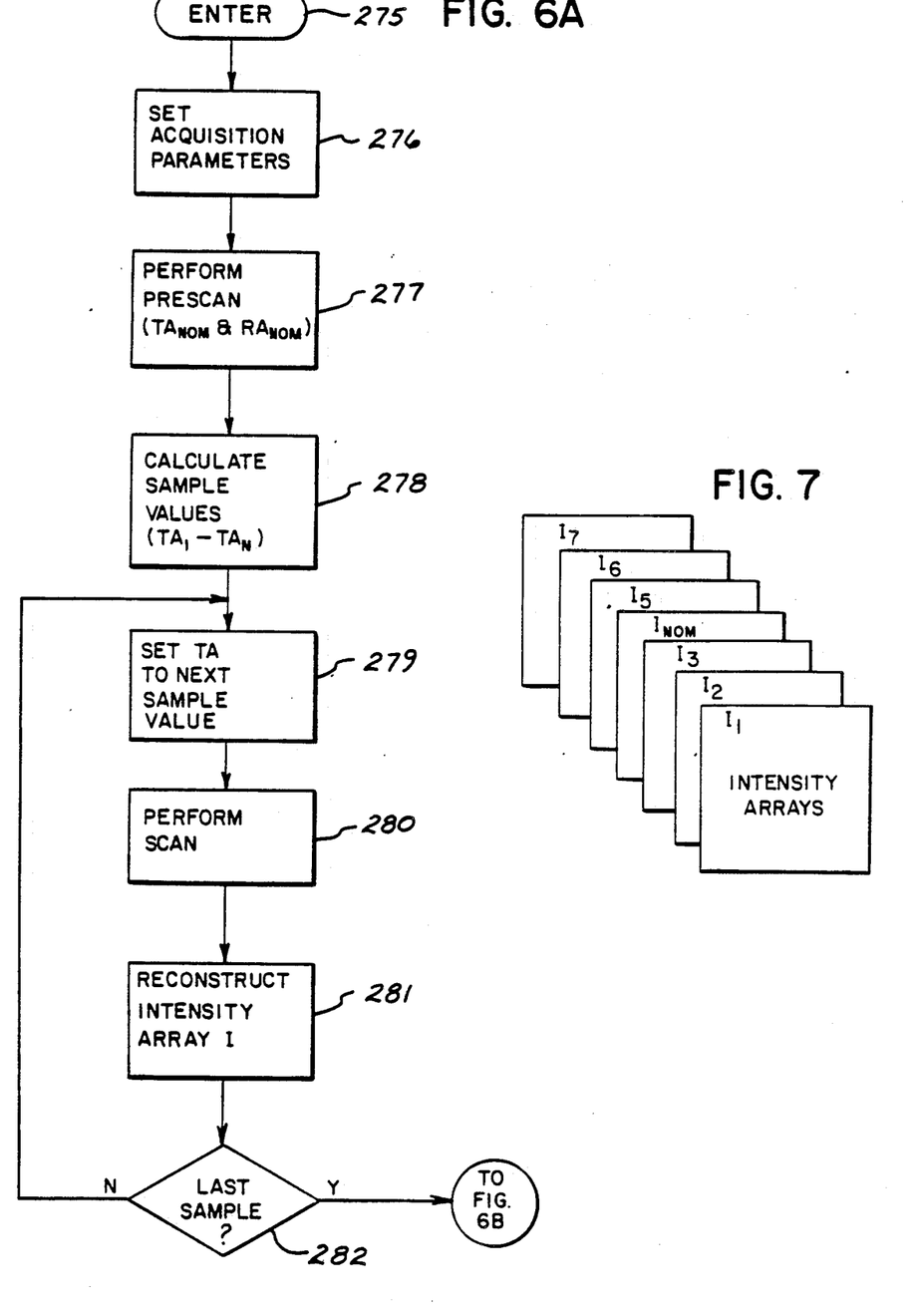
FIG. 6A-6B is a flow chart of a program which is executed by the system of FIG. 1 to carry out the preferred embodiment of the invention.
FIG. 7 is a pictorial representation of data produced by the NMR system of FIG. 1 when operated by the program of FIG. 6A.

The present invention is a procedure for separately and quantitatively measuring the inhomogeneities in both the RF transmit field and the RF receive field and displaying the information in a useful manner. This procedure may be employed as part of the NMR system calibration process, it may be employed just prior to selected NMR scans, or it may be employed as a troubleshooting tool or a design tool where the cause of undesirable shading effects in the image is sought. The information may also be used for retrospective image intensity correction. The invented procedure is implemented by the above described NMR system under the direction of a field mapping program which is executed by the CPU 101. Referring particularly to FIG. 6A, the field mapping program is entered at 275 and the acquisition parameters are input and set as indicated at process block 276. These parameters relate primarily to the specifics of the pulse sequence which is to be used in the NMR scan, and they include for the particular pulse sequence of FIG. 3:

TE = 20 to 30 milliseconds;
TR = 800 to 2,000 milliseconds;
Number of slices = 1 to 24;
Slice thickness = 5 to 10 millimeters;
Slice spacing = 10 millimeters or more;
Field of view = 32 to 48 centimeters; and
Image array size, x = 256 (readout direction),
y = 128 (phase encoding direction) to 192.

Using the selected scan parameters, a prescan is then performed as indicated by process block 277. This prescan is described in the above cited co-pending U.S. application Ser. No. 907,519 and it returns nominal values for the transmit attenuation ($TA_{nom}$) and the receiver attenuation ($Ra_{nom}$). These nominal values are the levels which maximize the integral of the object projection. The nominal transmit attenuation ($TA_{nom}$) is the value which will produce 90° and 180° flip angles in the bulk of the nuclear spins in the selected slice, and the nominal receive attenuation ($Ra_{nom}$) is one that prevents the peak value of the received NMR signal from over ranging the A/D converters when the transmit attenuation is set to its nominal value.

As indicated at process block 278, a set of N sample transmit attenuation values ($TA_1$ through $TA_N$) are then calculated. Seven sample values are employed in the preferred embodiment with the fourth, or center, sample value being $TA_{nom}$ and the remaining six samples being taken at equal intervals over a linear flip angle range which is symmetric about this central, $\theta = 90°$, nominal sample. For example the values of sample attenuation values $TA_1$ through $TA_7$ are selected to produce flip angles ($\theta$) of 30°, 50°, 70°, 90°, 110°, 130° and 150°, respectively.

After the sample transmit attenuation values have been determined, a loop is entered in which an NMR scan is performed with each sample transmit value $TA_1$ through $TA_N$. As indicated at process block 279, the sample transmit attenuation value is output to the transmit attenuator 206 (FIG. 2), and a complete NMR scan is performed, as indicated at process block 280. As described above with reference to FIG. 4, an image data array 250 is produced by the scan which indicates the magnitude of the acquired NMR signals throughout the selected slice As indicated by process block 281, a two-dimensional Fourier transformation is then performed on the acquired NMR data to produce an intensity array I. The intensity array I is a two-dimensional array (for example, 256 by 256) and each element therein indicates the intensity of the NMR signal at a corresponding physical location in the selected slice. The system loops at decision block 282 to repeat the NMR scan at each of the N sample transmit attenuation values. As shown in FIG. 7, seven separate intensity arrays $I_1$ through $I_7$ are thus produced with the middle array $I_4$ corresponding to the normal display data array 251 which is produced with the nominal transmit attenuation value $TA_{nom}$.

Figures 6B, 9, 10:
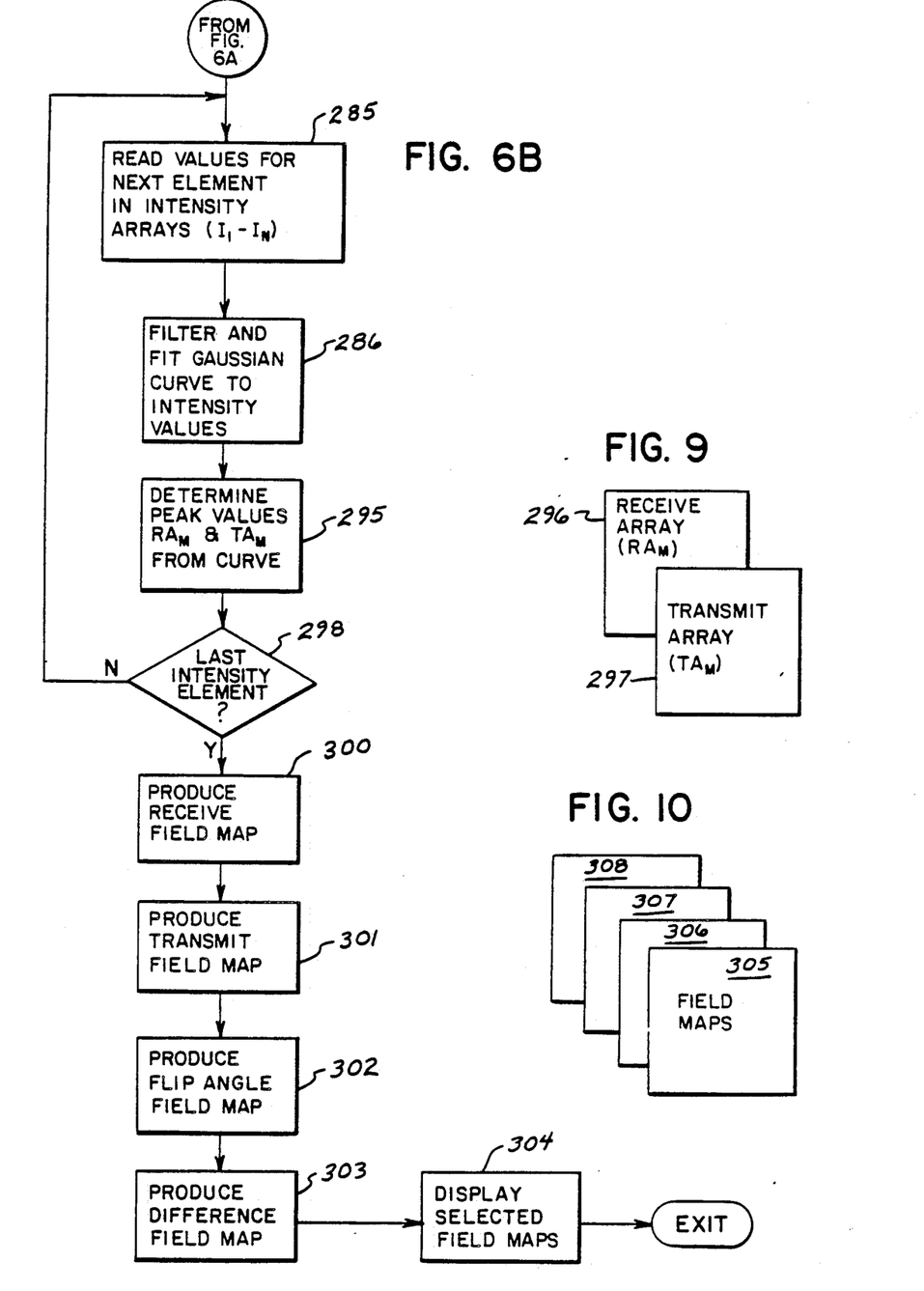
FIG. 9 is a pictorial representation of data produced by the NMR system of FIG. 1 when operated according to the present invention.
FIG. 10 is a pictorial representation of field maps which are data arrays produced by the NMR system of FIG. 1 in accordance with the present invention.
Figure 8:
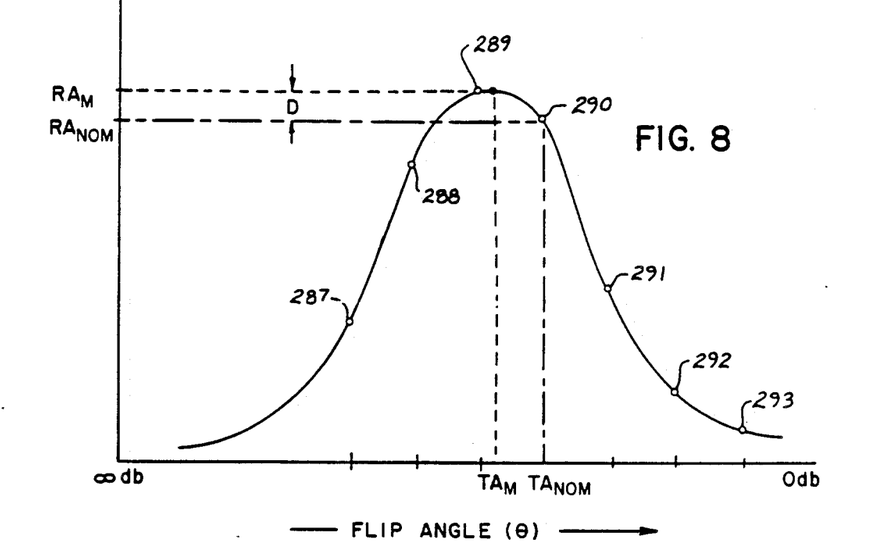
FIG. 8 is a graphic representation of a curve which is fit to data contained in the arrays of FIG. 7.

Referring particularly to FIG. 6B, the next step in the process is to examine the data at each location, or element, in the intensity arrays $I_1-I_7$ and fit a curve to that data. As indicated at process block 285, the intensity data is read from the same location in each of the intensity arrays $I_1-I_7$. These seven values represent the NMR signal intensity at a single location, or voxel, in the slice as the flip angle $\theta$ produced by the RF excitation pulse is incremented through its range of seven values. As explained above, these seven values lie approximately on a $\sin^3\theta$ curve, and as indicated at process block 286, the next step is to find the curve which best fits these seven intensity data points. The seven data points are first examined to determine if any are clearly not on such a curve, and after such points are filtered out, the remaining intensity data points are fit to a Gaussian curve. Such a curve fitting procedure is described in Chapter 8 of a book by Philip R. Bevington entitled *Data Reduction and Error Analysis For the Physical Sciences*, published in 1969 by McGraw-Hill Book Company. Such a curve is illustrated in FIG. 8, where points 287-293 are the seven intensity data points from the same location in the respective intensity data arrays $I_1-I_7$. Once the best curve has been fit to the intensity data points from a single location, the location of the peak in this curve is found by determining where its derivative is zero. This is accomplished at process block 295 in FIG. 6B, and the two coordinates of this peak $TA_M$ and $RA_M$, are saved in corresponding locations in a transmit array 297 and a receive array 296. As shown in FIG. 9, the receive and transmit arrays 296 and 297 have the same dimensions as the intensity arrays $I_1$-$I_7$ so that each of their elements correspond to a physical location in the slice and in the reconstructed image. All elements of the intensity arrays may be processed in this manner by a loop established at decision block 298. Intensity thresholds may be applied to bypass calculations on elements with negligible intensity, since they are probably outside the object of the image In any case, the receive and transmit arrays 296 and 297 are filled with corresponding peak receive amplitude values $RA_M$ and peak transmit attenuation values $TA_M$.

Referring particularly to FIGS. 6B, 8 and 10, after the receive and transmit arrays 296 and 297 have been produced, a variety of displayable field maps can be produced. As indicated by process block 300, the first of these is a receive field map 305 which is produced directly from the values in the receive array 296. The resulting display is an image which is a direct measure of inhomogeneities in the receive field of the NMR system, if the slice is taken through a phantom having uniform NMR characteristics. On the other hand, with a nonuniform subject, the receive field map 305 is an image of the subject with the effects of transmit field inhomogeneities removed.

As indicated by process block 301, a transmit field map 306 is produced next directly from the values $TA_M$ in the transmit array 297. The resulting display is an image which indicates those locations which require more RF excitation to achieve a 90° flip angle and those locations which require less RF excitation to achieve a 90° flip angle. The variations in brightness in this image are a measure of the degree of inhomogeneity in the transmit field.

A flip angle field map 307 can also be produced from the transmit array 297 as indicated at process block 302. The nominal transmit attenuation value ($TA_{nom}$) can be referenced to a 90° flip angle, for example, and the flip angles of other transmit attenuation values are then calculated as follows:

$$\theta = 90(10^{-[(TA_{nom} - TA)/20]})$$

where: $\theta$ is the flip angle for any transmit attenuation value TA in array 297.

When the flip angle field map 307 is displayed directly on a CRT screen, it is virtually the same as displayed transmit field map 306, except the sense, or sign, of the brightness level is reversed. That is, locations in which the nuclear spins are flipped less than 90° are darker and locations that are flipped more than 90° are brighter. This field map can also be converted to a contour map which connects locations in the slice of equal selected flip angles with lines much like isobars on topographic maps.

And finally, as indicated by process block 303, a difference field map 308 may be produced for display. This is produced by subtracting the values of each element in the intensity array $I_{nom}$ from their corresponding values $(RA_M)$ in the receive array 296. This difference value is shown at D in FIG. 8 and the display which is produced from these difference values highlights intensity differences which are due to RF transmit field inhomogeneity. As indicated by process block 304, any of the field maps produced according to the present invention can be displayed directly on a CRT after appropriate shifting and scaling of the dynamic range of the field map values to the brightness range of the display. In the alternative, of course, the field maps 305-308 may be stored in digital form for later use.

By producing the above described field maps, the transmit and receive RF fields of the entire region of interest can be profiled. The receive field map is most useful within a homogeneous object, where variations in the field map intensity may be attributed to position dependent receive coil sensitivity and not object composition variations. The difference field map further isolates and accentuates inhomogeneities in the transmit field of the loaded coil. The transmit field map, however, is useful in both heterogeneous and homogeneous objects since the object voxel absolute peak intensity is not determinative of the transmit field map calculations. One application, for example, is the determination of the spatial RF excitation field distribution in actual human subjects using different transmit and receive coil designs and combinations. This is very useful in the design of transmit coils and the effects of receive coil design on the transmit field due to unwanted coupling.

While in the preferred embodiment the pulse sequence used to perform the prescan and acquire data for the intensity arrays is the same as that used to acquire image data, this need not be the case. Of course, if different pulse sequences are used, the relationship between flip angle $\theta$ and NMR signal intensity may be different than the $\sin^3\theta$ relationship described herein. Accordingly, a characteristic curve other than the Gaussian curve should be fit to the acquired data in order to properly reflect this different relationship. Also, a number of measures can be taken to reduce the time necessary to carry out the scan and perform the calculations. For example, the scan time may be reduced by reducing the size of the intensity arrays in either or both dimensions, and the calculation time can be further reduced by averaging together groups of intensity values (for example, $2 \times 2$ neighborhoods) and calculating the field maps with this smaller set of average data.

We claim:

1. In an NMR system for conducting a scan in a region of interest and producing an array of intensity data indicative of the NMR signal strength at locations throughout the region of interest, the improvement comprising:

means for producing a set of intensity data arrays, each intensity data array being produced by conducting a scan at a different RF excitation field strength;

means coupled to the set of intensity data arrays for reading the corresponding data elements therein and fitting a characteristic curve to each set of corresponding data elements;

means coupled to the last named means for determining the peak value of each of the fitted characteristic curves and producing therefrom corresponding data elements in a receive array; and means coupled to the receive array for producing a field map which indicates by the intensity of its data elements inhomogeneities in the RF receive field of the NMR system.

2. The improvement as recited in claim 1 in which the field map is produced directly from the peak values in the receive array.

3. The improvement as recited in claim 1 in which the field map is produced by taking the difference between the peak values in the receive array and the values of corresponding elements in one of said set of intensity data arrays.

4. In an NMR system for conducting a scan in a region of interest and producing an array of intensity data indicative of the NMR signal strength at locations throughout the region of interest, the improvement comprising:

means for producing a set of intensity data arrays, each intensity data array being produced by conducting a scan at a different RF excitation field strength;

means coupled to the set of intensity data arrays for reading the corresponding data elements therein and fitting a characteristic curve to each set of corresponding data elements;

means coupled to the last named means for determining the location of the peak in each of the fitted characteristic curves and producing therefrom corresponding data elements in a transmit array; and means coupled to the transmit array for producing a field map which indicates by the intensity of its data elements inhomogeneities in the RF transmit field of the NMR system.

5. The improvement as recited in claim 4 in which the field map is produced directly from the location values in the transmit array.

6. The improvement as recited in claim 4 in which the field map is produced by calculating flip angle values $\theta$. as follows:

$$\theta = 90(10 - [(TA_{nom} - TA)/20])$$

where $TA_{nom}$ is one of said different RF excitation field strengths, and TA is the location value in the transmit array.

7. In an NMR system for conducting a scan in a region of interest and producing an array of intensity data indicative of the NMR signal strength at locations throughout the region of interest, the improvement comprising:

means for producing a set of intensity data arrays, each intensity data array being produced by conducting a scan at a different RF excitation field strength;

means coupled to the set of intensity data arrays for reading the corresponding data elements therein and fitting a characteristic curve to each set of corresponding data elements;

means coupled to the last named means for determining the coordinates of the peak in each of the fitted characteristic curves and producing therefrom corresponding data elements in a receive array and corresponding data elements in a transmit array; and means coupled to the receive and transmit arrays for producing a field map which indicates by the intensity of its data elements inhomogeneities in the RF field of the NMR system.

8. The improvement as recited in claim 7 in which the characteristic curve is a Gaussian curve and the coordinates of its peak indicate a maximum NMR signal intensity value ($RA_M$) and the RF excitation field strength ($TA_M$) necessary to produce this maximum value.

9. The improvement as recited in claim 7 in which the means for producing a set of intensity data arrays includes:

means for performing a prescan in which a nominal RF excitation field strength is determined; and means coupled to the last named means for selecting the different RF excitation field strengths such that one scan is conducted at said nominal RF excitation field strength, a second scan is conducted at an RF field strength less than the nominal value, and a third scan is conducted at an RF field strength more than the nominal value.

10. The improvement as recited in claim 7 in which a set of seven intensity data arrays are produced by conducting seven scans at seven different RF excitation field strengths.

* * * * *